United States Patent [19]

Takahashi

[11] Patent Number: 4,612,657

[45] Date of Patent: Sep. 16, 1986

[54] DEVICE FOR DETECTING MOMENTARY CUTOFF OF AC POWER SOURCE

[75] Inventor: Harumi Takahashi, Yokohama, Japan

[73] Assignee: Ricoh Company, Ltd., Tokyo, Japan

[21] Appl. No.: 600,064

[22] Filed: Apr. 13, 1984

[30] Foreign Application Priority Data

Apr. 19, 1983 [JP] Japan .................................. 58-68834

[51] Int. Cl.⁴ .............................................. G05B 1/03
[52] U.S. Cl. ........................................ 377/32; 377/39
[58] Field of Search ................... 377/32, 39; 340/635; 368/66; 318/706, 710; 361/236, 240, 241, 242

[56] References Cited

U.S. PATENT DOCUMENTS

| | | | |
|---|---|---|---|
| 4,245,150 | 1/1981 | Driscoll et al. | 377/32 |
| 4,276,468 | 6/1981 | Nagamoto et al. | 377/39 |
| 4,323,976 | 4/1982 | Radaelli et al. | 377/39 |
| 4,420,814 | 12/1983 | Arikawa et al. | 377/39 |
| 4,468,796 | 9/1984 | Suga | 377/39 |
| 4,473,786 | 9/1984 | Miyashita et al. | 318/602 |
| 4,521,894 | 6/1985 | Moffat | 377/39 |

FOREIGN PATENT DOCUMENTS 58-36187  3/1983  Japan .................................. 318/602

Primary Examiner—Stanley D. Miller
Assistant Examiner—Karl Ohralik
Attorney, Agent, or Firm—David G. Alexander

[57] ABSTRACT

A device for detecting a momentary cutoff of an AC power source which is used with a data processing apparatus or the like. The device determines that a momentary cutoff has occurred in the AC power source when an actual rotation speed of a motor energized by the AC power source for rotation is lower than a predetermined rotation speed.

3 Claims, 5 Drawing Figures

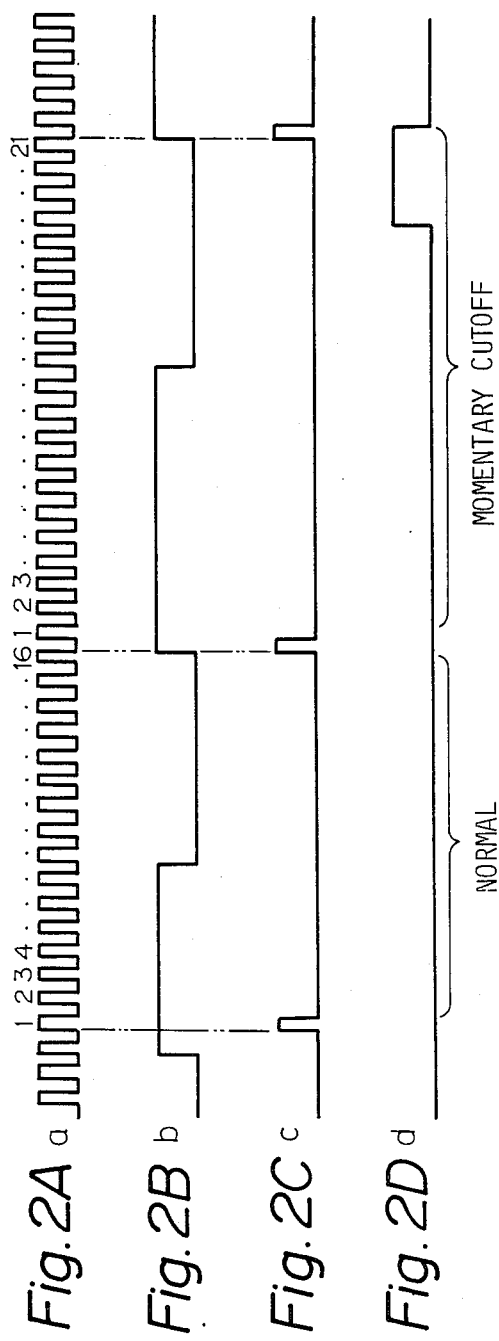

DEVICE FOR DETECTING MOMENTARY CUTOFF OF AC POWER SOURCE

BACKGROUND OF THE INVENTION

The present invention relates to a device for detecting a momentary cutoff or of an AC power source which is used with a data processing apparatus or the like.

Today, various kinds of data processing apparatuses are available and extensively used in various fields. A data processing apparatus is generally powered by an AC power source and constructed to prepare a DC power source from the AC power source so that various electronic circuits in the apparatus may be supplied with DC power from the DC power source. Assuming that the data processing apparatus is used for magnetically filing data, for example, data are accidentally and frequently destructed although the protection of data is a primary requisite. One of the causes of data destruction is the disturbance to the DC power source which results from a momentary cutoff of the AC power source. Momentary cutoff of an AC power source in turn is entailed by, for example, a failure of the power source itself or some critical accident occurred in another apparatus which shares the AC power source with the data processing apparatus. In any case, it is undesirable to deliver or write signals which have been effected by disturbance to the DC power source.

In order to protect data from disturbance to a DC power source which originates from a momentary cutoff of an AC power source, the momentary cutoff may be detected by comparing a DC reference voltage and a signal output from a capacitor-resistor (CR) intergrator circuit which is connected to the AC power source, as disclosed in Japanese Patent Laid-Open Publication No. 52-83144/1977. A problem encountered with this method is that, due to the use of a CR integrator circuit, it is incapable of responding to fast momentary cutoffs. Concerning the commercially available frequency (50 Hz or 60 Hz for example), the duration of cutoffs detectable with such a method is not shorter than about 10 milliseconds.

SUMMARY OF THE INVENTION

It is therefore an object of the present invention to provide a momentary cutoff detection device for an AC power source used for various data processing apparatuses which detects a momentary cutoff of an AC power source with excellent performance.

It is another object of the present invention to provide a momentary cutoff detection device for an AC power source used for various data processing apparatuses which is capable of detecting even a momentary cutoff which is as short as the order of several milliseconds in the commercially available frequency.

It is another object of the present invention to provide a generally improved momentary cutoff detection device for an AC power source.

A device for detecting a momentary cutoff of an AC power source of the present invention comprises a synchronous motor which is rotatable energized by the AC power source, a speed sensor for sensing a rotation speed of the synchronous motor, and a decision circuit for detecting a rotation speed which is sensed by the speed sensor means and determining that the AC power source is in a momentary cutoff when the detected rotation speed is different from a predetermined rotation speed.

In accordance with the present invention, a device for detecting a momentary cutoff of an AC power source which is used with a data processing apparatus of the like is disclosed. The device determines that a momentary cutoff has occurred in the AC power source when an actual rotation speed of a motor energized by the AC power source for rotation is lower than a predetermined rotation speed.

The above and other objects, features and advantages of the present invention will become apparent from the following detailed description taken with the accompanying drawings.

BRIEF DESCRIPTION OF THE DRAWING

FIGS. 2a, 2b, 2c and 2d are timing charts representative of the operation of the device shown in FIG. 1.

DESCRIPTION OF THE PREFERRED EMBODIMENT

Figure 1:
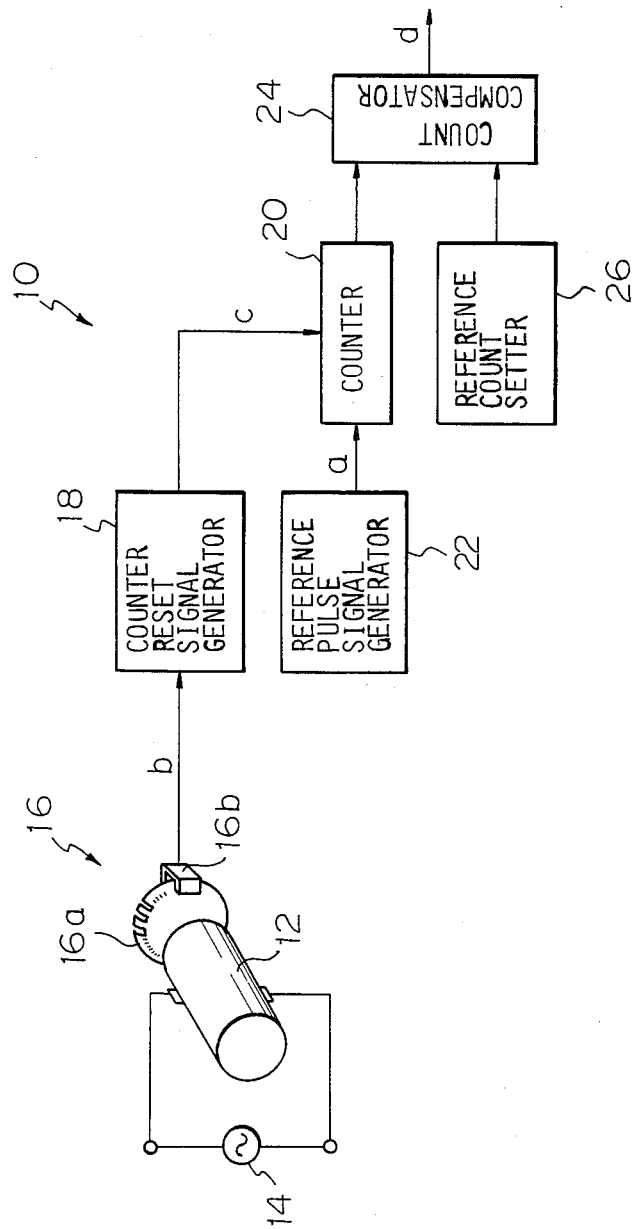
FIG. 1 is a diagram of a momentary cutoff detection device for an AC power source embodying the present invention.

While the device for detecting a momentary cutoff of an AC power source of the present invention is susceptible of numerous physical embodiments, depending upon the environment and requirements of use, a substantial number of the herein shown and described embodiment have been made, tested and used, and all have performed in an eminently satisfactory manner.

Referring to FIGS. 1 and 2, one embodiment of the momentary cutoff detection device in accordance with the present invention is shown and generally designated by the reference numberal 10. A synchronous motor 12 is connected to an AC power source 14. An encoder 16 is made up of an encoder disc 16a connected to an output shaft of the synchronous motor 12, and a photosensor 16b which comprises a light emitting element and a light receiving element. The photosensor 16b is connected to a counter reset signal generator 18 which is in turn connected to a counter 20. Also connected to the counter 20 is a reference pulse signal generator 22. The counter 20 is connected to a counter comparator 24. A reference count setter 26 is also connected to the count comparator 24.

The photosensor 16b usually develops a pulse signals such as a pulse signal b shown in FIG. 2B. The period of the pulse signal b is inversely proportional to the rotation speed of the motor 12, that is, it decreases with the increase in the motor rotation speed and increases with the decrease in the motor rotation speed.

It will be noted that the use of an asynchronous motor in place of the synchronous motor 12 is unfeasible for the device of the present invention because its rotation speed would undergo changes in response to even negligible changes of its input voltage and in response to fluctuation of its load. A synchronous motor rotates at a constant speed despite any change of the input voltage or that of the load and, therefore, it is desirable for the detection of momentary cutoffs of an AC power source, particularly momentary cutoffs which lower the voltage to about zero volt. In the case of a synchronous motor, it will sometimes be desired to install a small load resistance in a drive system associated with the motor.

A characteristic feature of the present invention resides in detecting a momentary cutoff of the AC power source 14 by discriminating whether the rotation speed of the synchronous motor 12 is normal. For the discrimination, the counter 20 counts up reference pulses such as pulses a shown in FIG. 2A output from the reference pulse signal generator 22 and which appear in one cycle of the pulse signal b output from the photosensor 16b of the encoder 16, while the count comparator 24 compares the count of the pulses a with a reference count which is predetermined by the reference count setter 26. For this purpose, the counter reset signal generator 18 generates a pulse signal c shown in FIG. 2C which resets the count of the reference pulses a at every cycle of the pulse signal b output from the photosensor 16b of the encoder 16. In the example shown in FIG. 2, the counter 20 is usually incremented up to "16" and, upon reaching it, reset by the counter reset signal c.

When the AC power source 14 has been momentarily cut off, the rotation speed of the synchronous motor 12 is decreased so that the number of the reference pulses a counted by the counter 20 of one cycle of the pulse signal b output from the photosensor 16b is increased. In the example shown in FIG. 2, the counter 20 is assumed to have counted "21" reference pulses a for the period concerned. Where the reference count designed for the reference count setter 26 is "17", for example, the count comparator 26 compares the number of pulses output from the counter 20 with the reference number output from the reference count setter 26 and generates such as signal as a signal d shown in FIG. 2D, which becomes high level when the output of the counter 20 is larger than that of the reference count setter 26. In this manner, the momentary cutoff of the AC power source 14 is represented by the appearance of a high level in the output signal d of the count comparator 26.

In summary, it will be seen that the present invention provides a momentary cutoff detection device for an AC power source which effectively detects a momentary cutoff even if its duration is quite short and, thus, attains a remarkably enhanced detection performance.

Various modifications will become possible for those skilled in the art after receiving the teachings of the present disclosure without departing from the scope thereof.

What is claimed is:

1. A device for protecting data by detecting a momentary cutoff of AC power to a data processing unit from an AC power source, comprising:
   a synchronous motor which is rotatably energized by the AC power source;
   speed sensor means for sensing a rotation speed of the synchronous motor; and
   decision means for detecting a rotation speed which is sensed by said speed sensor means and determining that the AC power source is in a momentary cutoff when the detected rotation speed is lower than the predetermined rotation speed by a predetermined amount so that no loss of said data occurs.

2. A device as claimed in claim 1, in which the synchronous motor comprises an output shaft, the speed sensor means comprising an encoder disc connected to the output shaft of the synchronous motor to be rotated integrally therewith, and a photosensor for generating a pulse signal which is associated with a rotation of said encoder disc, said photosensor comprising a light emitting element and a light receiving element.

3. A device as claimed in claim 2, in which the decision means comprises a reference pulse signal generator for generating a reference pulse signal, a counter for counting reference pulses of the reference pulse signal which appear during one pulse signal output from the photosensor, a reference count setter for setting a reference count, a count comparator for comparing a count output from said counter with the reference count, and a counter reset pulse signal generator for generating reset pulses for resetting a count of the reference pulses at an end of every pulse signal output from the photosensor.

* * * * *